US011227801B2

(12) United States Patent
Xie et al.

(10) Patent No.: US 11,227,801 B2
(45) Date of Patent: Jan. 18, 2022

(54) FORMATION OF CONTACTS FOR SEMICONDUCTOR DEVICES

(71) Applicant: INTERNATIONAL BUSINESS MACHINES CORPORATION, Armonk, NY (US)

(72) Inventors: Ruilong Xie, Niskayuna, NY (US); Su Chen Fan, Cohoes, NY (US); Heng Wu, Guilderland, NY (US); Julien Frougier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/823,876

(22) Filed: Mar. 19, 2020

(65) Prior Publication Data
US 2021/0296178 A1    Sep. 23, 2021

(51) Int. Cl.
*H01L 21/8234*    (2006.01)
*H01L 21/762*    (2006.01)
*H01L 29/06*    (2006.01)
*H01L 29/08*    (2006.01)
*H01L 29/66*    (2006.01)
(Continued)

(52) U.S. Cl.
CPC .......... *H01L 21/823418* (2013.01); *H01L 21/76229* (2013.01); *H01L 21/823468* (2013.01); *H01L 21/823475* (2013.01); *H01L 29/0653* (2013.01); *H01L 29/0847* (2013.01); *H01L 29/6656* (2013.01); *H01L 29/66666* (2013.01); *H01L 29/7827* (2013.01)

(58) Field of Classification Search
CPC ..... H01L 21/823431; H01L 21/823821; H01L 21/845; H01L 21/823475; H01L 21/823871; H01L 21/823487; H01L 21/823885; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 21/823418; H01L 21/823425
See application file for complete search history.

(56) References Cited

U.S. PATENT DOCUMENTS 8,829,646 B2   9/2014 Lung
9,312,383 B1   4/2016 Cheng et al.
(Continued)

FOREIGN PATENT DOCUMENTS

CN    100456496 C    1/2009
CN      1802755 B    6/2012
WO    2018189205 A1   10/2018

*Primary Examiner* — Sonya McCall-Shepard
(74) *Attorney, Agent, or Firm* — Tutunjian & Bitetto, P.C.; Erik Johnson

(57) ABSTRACT

A method for fabricating a semiconductor device includes forming top source/drain contact material on top source/drain material disposed on one or more fins of a base structure, and subtractively patterning the top source/drain contact material to form at least one top source/drain contact. The at least one top source/drain contact has a positive tapered geometry. The method further includes cutting exposed end portions of the top source/drain material to form at least one top source/drain region underneath the at least one top source/drain contact.

20 Claims, 10 Drawing Sheets

(51) Int. Cl.
  *H01L 29/78*     (2006.01)
  *H01L 29/417*    (2006.01)

(56)         References Cited

U.S. PATENT DOCUMENTS

| | | | |
|---|---|---|---|
| 9,653,575 | B1* | 5/2017 | Basker ................. H01L 23/535 |
| 9,735,253 | B1 | 8/2017 | Bi et al. |
| 10,229,986 | B1 | 3/2019 | Jagannathan et al. |
| 10,297,688 | B2 | 5/2019 | Cheng et al. |
| 10,361,315 | B1 | 7/2019 | Yeh et al. |
| 2017/0012126 | A1 | 1/2017 | Chu-Kung et al. |
| 2017/0098609 | A1* | 4/2017 | Harrington, III ..... H01L 23/535 |
| 2018/0122706 | A1 | 5/2018 | Cheng et al. |
| 2018/0138093 | A1 | 5/2018 | Adusumilli et al. |
| 2018/0197787 | A1 | 7/2018 | Anderson et al. |

\* cited by examiner

300

---

Form a base structure of a vertical transistor device on a substrate,
the base structure including a bottom source/drain region, one or more fins,
one or more gate structures, and one or more first ILD layers
302

↓

Form top source/drain material on the one or more fins
304

↓

Form top source/drain contact material on the top source/drain material
306

↓

Subtractively etch the top source/drain contact material
to form at least one top source/drain contact
308

↓

Cut exposed end portions of the top source/drain material to form at least one
top source/drain region underneath the at least one top source/drain contact
310

↓

Form one or more second ILD layers on the one or more first ILD layers
312

↓

Form a plurality of contacts including at least one bottom
source/drain contact on the bottom source/drain region and at
least one gate contact on the one or more gate structures
314

FORMATION OF CONTACTS FOR SEMICONDUCTOR DEVICES

BACKGROUND

The present invention generally relates to semiconductor devices, and more particularly to the formation of contacts for semiconductor devices.

Vertical transistors, such as, e.g., vertical field-effect transistors (FETs), have been devised as a way to decrease unit cell size by orienting the current flow vertically so the device footprint is not limited to the gate length and source/drain size. Vertical transistors can be used as a viable complementary metal-oxide semiconductor (CMOS) architecture beyond the 7 nm technology node.

SUMMARY

In accordance with an embodiment of the present invention, a method for fabricating a semiconductor device is provided. The method includes forming top source/drain contact material on top source/drain material disposed on one or more fins of a base structure, and subtractively patterning the top source/drain contact material to form at least one top source/drain contact. The at least one top source/drain contact has a positive tapered geometry. The method further includes cutting exposed end portions of the top source/drain material to form at least one top source/drain region underneath the at least one top source/drain contact.

In accordance with another embodiment of the present invention, a method for fabricating a semiconductor device is provided. The method includes forming top source/drain material merged across at least a first fin and a second fin disposed on a bottom source/drain region of a base structure, forming top source/drain contact material on the top source/drain material, and subtractively patterning the top source/drain contact material to form at least a first top source/drain contact. The at least one top source/drain contact having a positive tapered geometry. The method further includes cutting exposed end portions of the top source/drain material to form a plurality of top source/drain regions including at least merged first and second top source/drain regions underneath the at least one top source/drain contact. The first top source/drain contact is formed on the merged first and second top source/drain regions.

In accordance with yet another embodiment of the present invention, a semiconductor device is provided. The device includes a substrate a bottom source/drain region disposed on the substrate, one or more fins disposed on the bottom source/drain region, one or more top source drain/regions disposed on respective ones of the one or more fins, one or more gate structures adjacent to the one or more fins, at least one bottom source/drain contact and at least one gate contact each having a negative tapered geometry, and at least one top source/drain contact having a positive tapered geometry.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 10 is a block/flow diagram illustrating a system/method for fabricating a semiconductor device, in accordance with an embodiment of the present invention.

DETAILED DESCRIPTION

Figure 1:
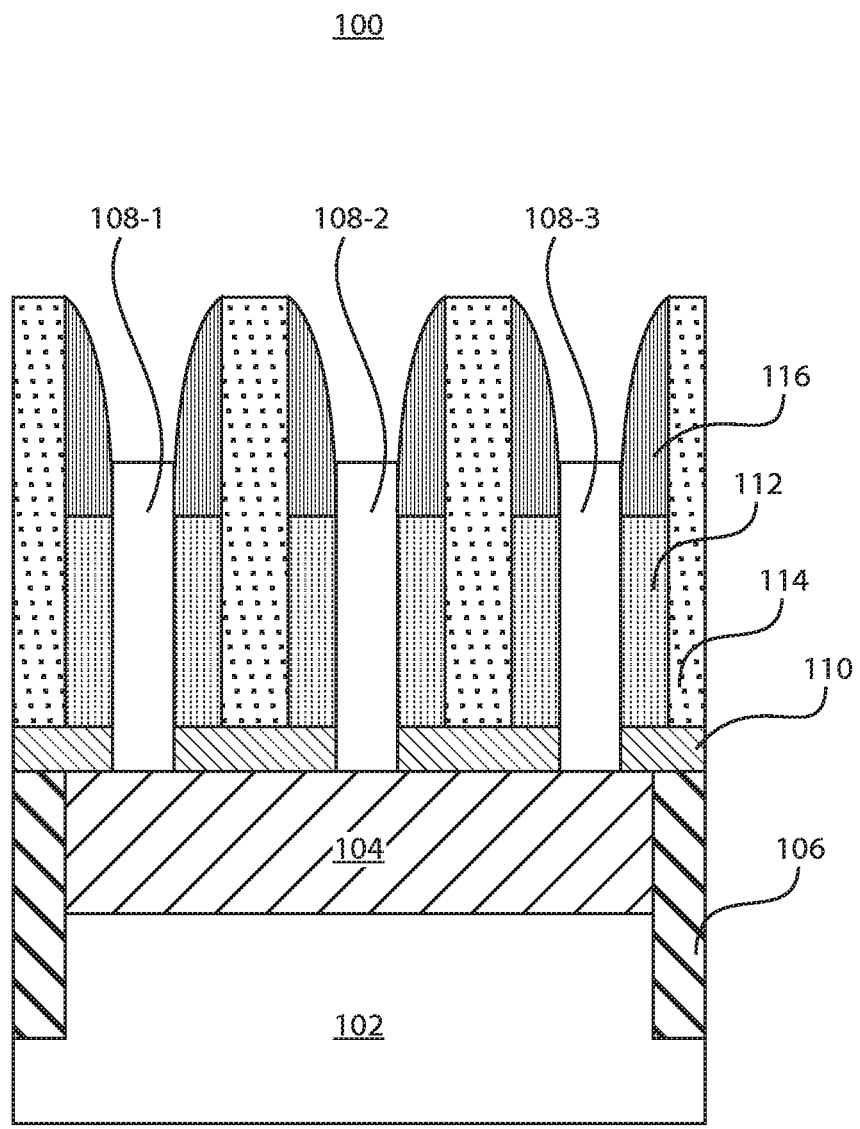
FIG. 1 is a cross-sectional view of a base structure formed on a substrate during the fabrication of a semiconductor device, in accordance with an embodiment of the present invention.

The embodiments described herein provide for the formation of a semiconductor device having contacts that reduce risk of device shorts. More specifically, the embodiments described herein can provide for the formation of semiconductor device including a vertical transistor device (e.g., a VTFET) having a top source/drain contact with a positive tapered geometry (e.g., positive tapered profile), and a bottom source/drain contact and gate contact with negative tapered geometries (e.g., negative tapered profiles). In the case of a VTFET device having multiple fins, top source/drain regions disposed on respective fins underneath the same top source/drain contact can be merged.

To form the vertical transistor device, top source/drain contact material can be formed on a top source/drain region, which can be a merged top source/drain region shared by at least two semiconductor fins. At least one top source/drain contact can be formed by patterning the top source/drain contact material using a subtractive patterning process, and end portions of the top source/drain contact material exposed by the subtractive patterning can be cut to isolate the vertical transistor device. At least one bottom source/drain contact and at least one gate contact can be formed using a damascene trench process, where conductive material is formed within a trench. The top source/drain contact can have a positive tapered geometry due to the subtractive patterning process, whereas the bottom source/drain contact and the gate contact can have negative tapered geometry due to the damascene trench process.

As a further result of the subtractive patterning process, in some embodiments, the vertical transistor device can further include a barrier liner disposed along a bottom surface of the at least one top source/drain contact (and not on the sidewalls of the top source/drain contact). The barrier line can be further formed along bottom surfaces and sidewalls of the at least one bottom source/drain contact and the at least one gate contact. Moreover, the at least one top source/drain region can be self-aligned to the at least one top source/drain contact, and can have an abrupt shape, as a result of cutting the top source/drain epitaxial material using the top source/drain contact as a mask.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 2:
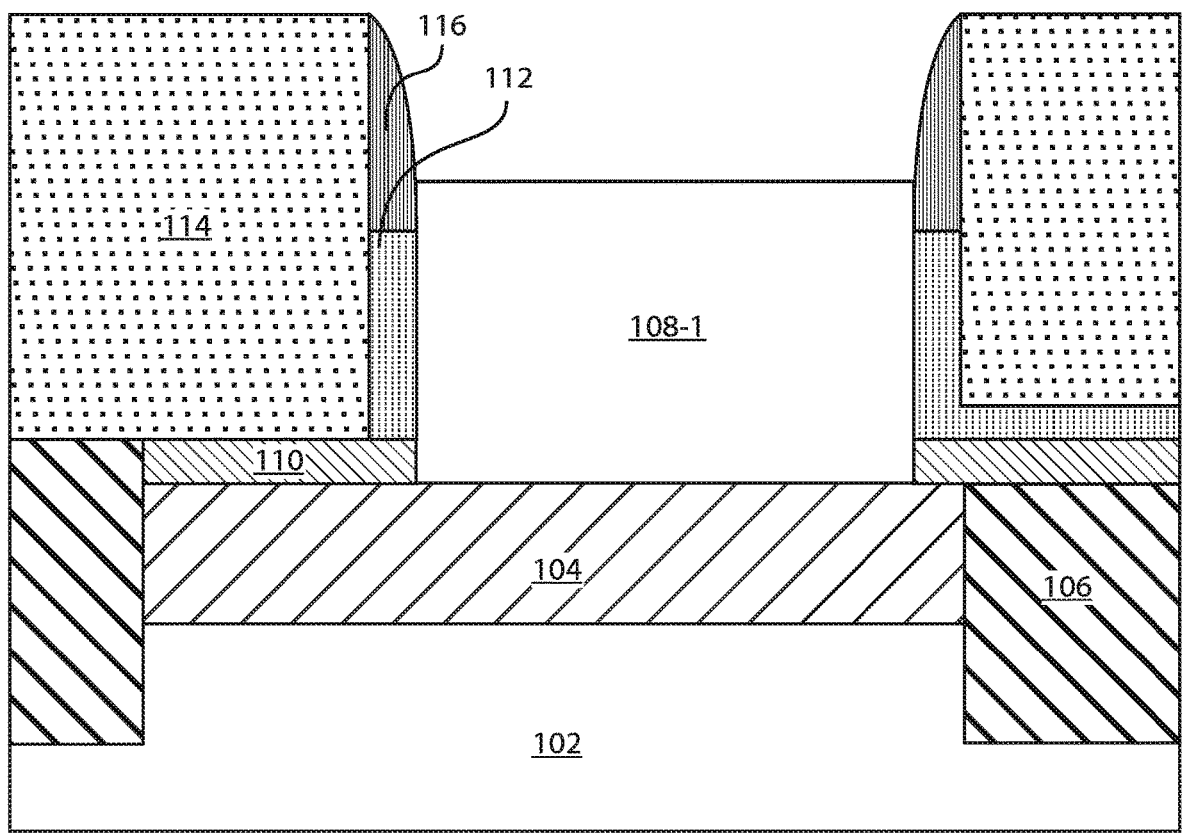
FIG. 2 is another cross-sectional view of the semiconductor device of FIG. 1, in accordance with an embodiment of the present invention.

Referring now to the drawings in which like numerals represent the same or similar elements and initially to FIGS. 1 and 2, a semiconductor device 100 is shown including a substrate 102. More specifically, FIG. 1 shows a cross-sectional view of the device 100 across a fin cut, while FIG. 2 shows a cross-sectional view of the device 100 along the fin cut.

The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide.

As further shown, a bottom source/drain region 104 is formed on the substrate 102, and shallow trench isolation (STI) regions 106 are formed on the substrate to a height of the bottom source/drain region 104. The bottom source/drain region 104 and the STI regions 106 can include any suitable materials in accordance with the embodiments described herein. For example, the bottom source/drain region 104 can include epitaxially material that is epitaxially grown or deposited on the substrate 102. The STI regions 106 can include, e.g., silicon dioxide ($SiO_2$) or other suitable dielectric material.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

As further shown, a plurality of semiconductor fins ("fins") including fins 108-1 through 108-3 are formed on the bottom source/drain region 104. That is, in this embodiment, the fins 108-1 through 108-3 share a common bottom source/drain region. However, such an embodiment should not be considered limiting. The plurality of fins can include any suitable material in accordance with the embodiments described herein. For example, the plurality of fins can include, e.g., Si, Ge, SiGe, or other suitable semiconductor material.

As further shown, a bottom spacer 110 is formed on the bottom source/drain region 104 and STI regions 106 adjacent to the fins 108-1 through 108-3. The bottom spacer 110 can include any suitable dielectric material in accordance with the embodiments described herein. Examples of materials that can be used to form the bottom spacer 110 include, but are not limited to, $SiO_2$, silicon nitride (SiN), etc.

As further shown, gate structures 112 are formed on the bottom spacer 110 and along the sidewalls of the fins 108-1 through 108-3. The gate structures 112 can include any suitable materials in accordance with the embodiments described herein. More specifically, the gate structures 112 can include a gate dielectric and a gate conductor.

In one embodiment, the gate structures 112 can include high-k metal gate (HKMG) materials. HKMG material includes a high-k dielectric material as the gate dielectric and a metal gate as the gate conductor (as opposed to a polysilicon gate). A high-k dielectric material is one that has a dielectric constant k greater than the dielectric constant of $SiO_2$ at room temperature (e.g., about 20° C.-25° C.) and atmospheric pressure (e.g., about 1 atm). For example, a high-k dielectric material can have a dielectric constant of greater than about 3.9. Examples of high-k dielectric materials that can be used include, but are not limited to, hafnium silicate ($HfO_4Si$), zirconium silicate ($ZrSiO_4$), hafnium dioxide ($HfO_2$) and zirconium dioxide ($ZrO_2$).

As further shown, interlevel dielectric (ILD) layers 114 are formed on the bottom spacer 110 providing insulation between the gate structures 112. The ILD layers 114 can include any suitable dielectric material in accordance with the embodiments described herein. For example, the ILD layers 114 can include, e.g., $SiO_2$ or other suitable dielectric material.

As further shown, pairs of top spacers 116 are each formed on a gate structure 112 adjacent to one of the fins 108-1 through 108-3. The top spacers 116 can include any suitable dielectric material in accordance with the embodiments described herein. Examples of materials that can be used to form the bottom spacer 110 include, but are not limited to, $SiO_2$, silicon nitride (SiN), etc.

Figure 3:
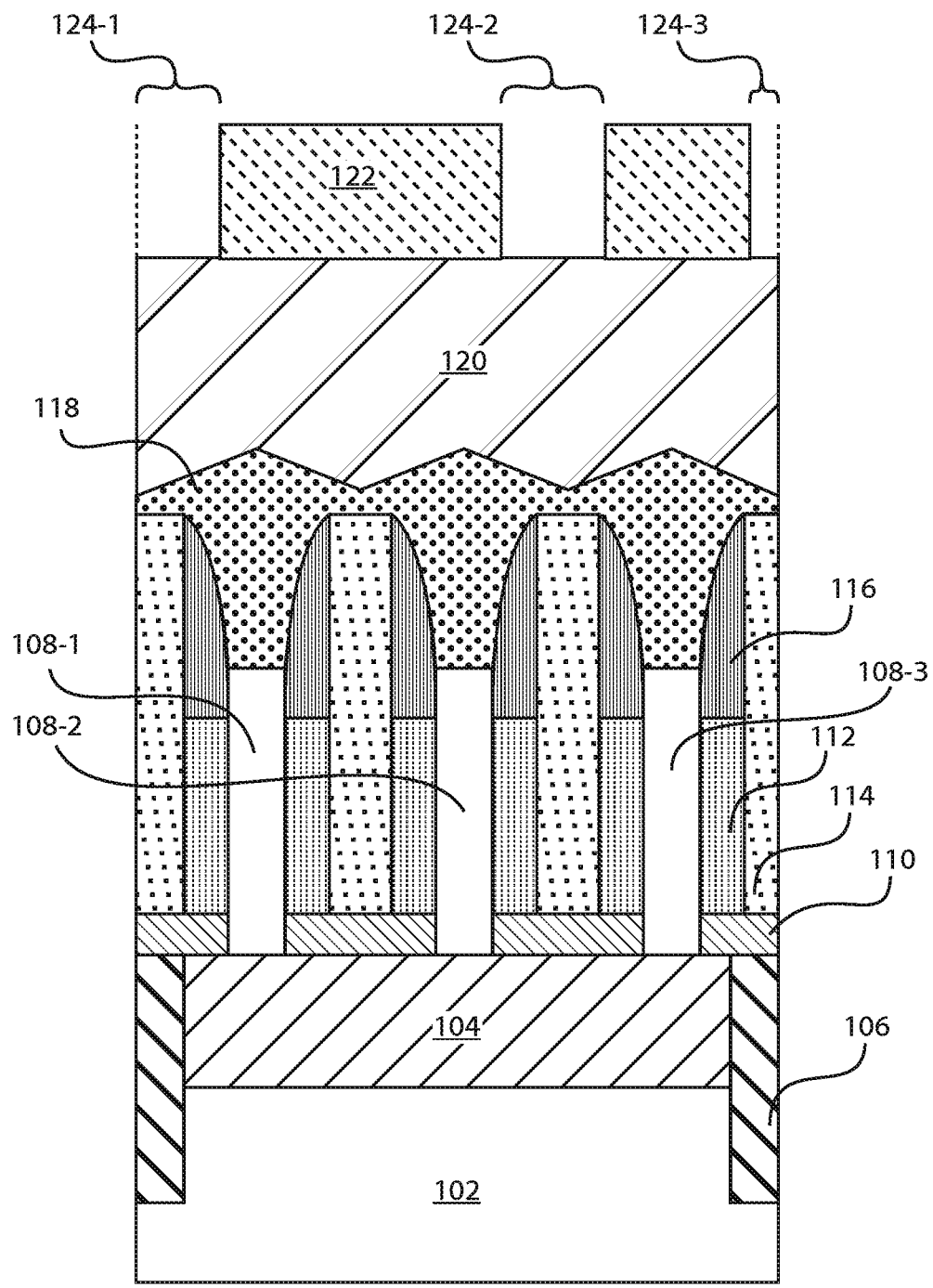
FIG. 3 is a cross-sectional view of the formation of top source/drain regions, contact material and patterning masks during the fabrication of the semiconductor device, in accordance with an embodiment of the present invention.
Figure 4:
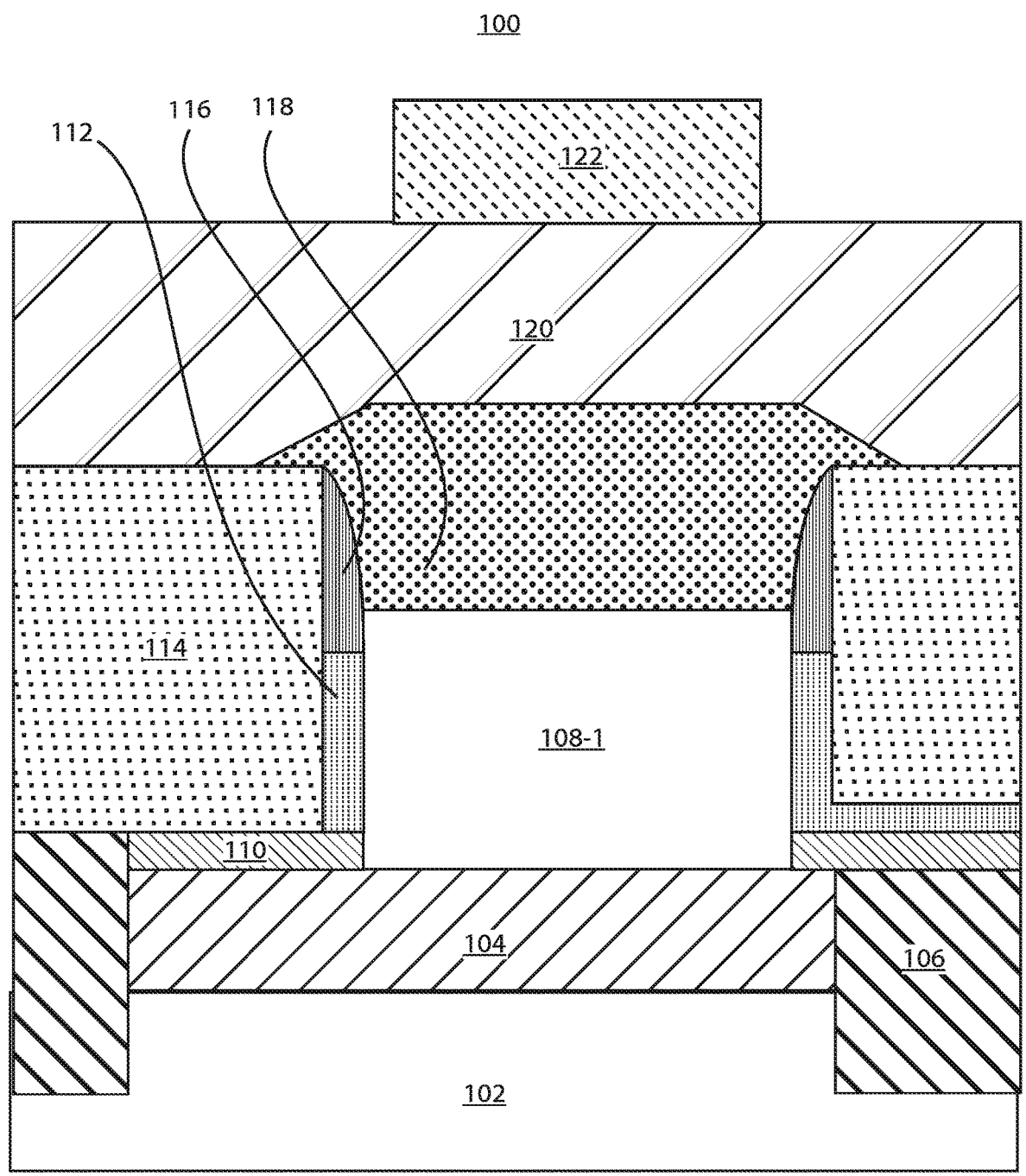
FIG. 4 is another cross-sectional view of the semiconductor device of FIG. 3, in accordance with an embodiment of the present invention.

With reference to FIGS. 3 and 4, in which FIG. 3 shows the cross-sectional view of the device 100 across the fin cut and FIG. 4 shows the cross-sectional view of the device 100 along a fin cut, top source/drain region material 118 is formed on the fins 108-1 through 108-3 extending above the ILD layers 114 and the top spacers 116. As shown in this embodiment, the top source/drain region material 118 can purposely be formed to be merged. The top source/drain region material 118 can include any suitable material in accordance with the embodiments described herein. For example, the top source/drain region material 118 can include an epitaxially grown material.

As further shown, top source/drain contact material 120 is formed on the top source/drain region material 118. The top source/drain contact material 120 can be formed as wrap around contact material. The top source/drain contact material 120 can include any suitable material in accordance with the embodiments described herein. Examples of materials that can be used to form the top source/drain contact material 120 include, but are not limited to, copper (Cu), cobalt (Co), tantalum (Ta), ruthenium (Ru), titanium (Ti), and/or other suitable conductive materials or metals. In one embodiment, the top source/drain contact material 120 includes a metal silicide. For example, the top source/drain contact material 120 can include, e.g., a Ti-based silicide.

As further shown, patterning material 122 separated by gaps 124-1 through 124-3 are formed on the top source/drain contact material 120. As will be described in further detail below with reference to FIG. 5, a subtractive patterning process will be used to pattern top source/drain contacts from the top source/drain contact material 120, and the top source/drain region material 118 will be cut to form top source/drain regions. The patterning material 122 can include any suitable material in accordance with the embodiments described herein. Examples of materials that can be used to form the patterning material 122 include, but are not limited to, hardmask material and/or organic planarization layers (OPLs).

Figure 5:
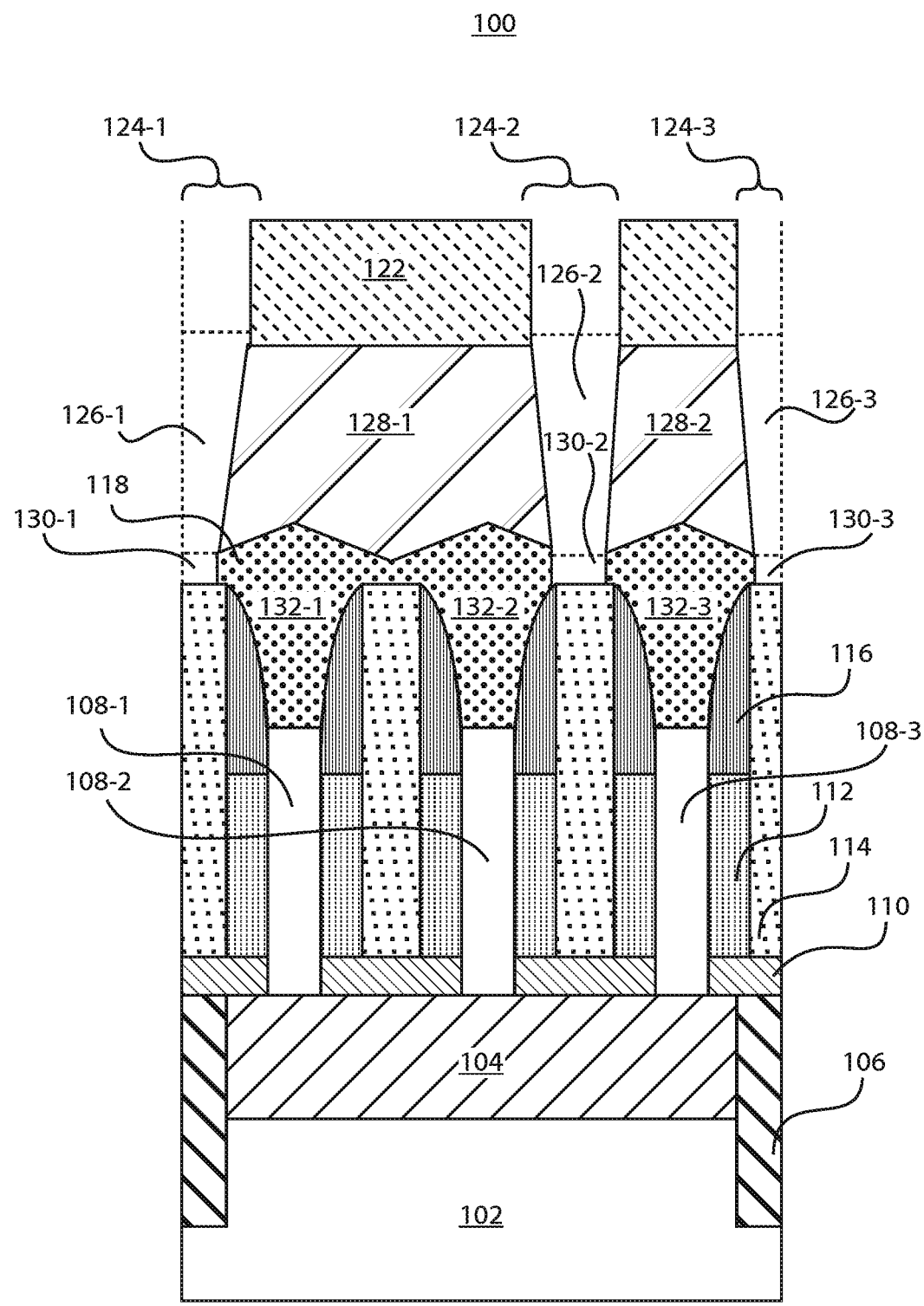
FIG. 5 is a cross-sectional view of patterning of the contact material using a subtractive patterning process and a cut of exposed end portions of the top source/drain regions after the patterning during the fabrication of the semiconductor device, in accordance with an embodiment of the present invention.

With reference to FIG. 5, the cross-sectional view of the device 100 across the fin cut is provided showing the patterning of the top source/drain contact material 120 using a subtractive patterning process to form a first set of cavities 126-1 and 126-2 and top source/drain contacts 128-1 and 128-2. Any suitable subtractive patterning process can be used to pattern the top source/drain contact material 120 in accordance with the embodiments described herein. In one embodiment, a subtractive reactive-ion etch (RIE) process can be used to pattern the top source/drain contact material 120 to form the top source/drain contacts 128-1 and 128-2.

After the top source/drain contact material 120 is patterned, exposed end portions of the top source/drain region material 118 are cut to form a second set of cavities 130-1 through 130-3 and top source/drain regions 132-1 through 130-3. Any suitable process can be used to cut the exposed end portions of the top source/drain region material 118 in accordance with the embodiments described herein.

As shown in this illustrative embodiment, the top source/drain contact 128-1 in this embodiment is shared between the top source/drain regions 132-1 and 132-2, which are merged, while the top source/drain contact 128-2 is disposed on the single top source/drain region 132-3. As further shown, the top source/drain contacts 128-1 and 128-2 each have a positive tapered geometry (e.g., positive tapered profile) as a result of the subtractive patterning process.

Figure 6:
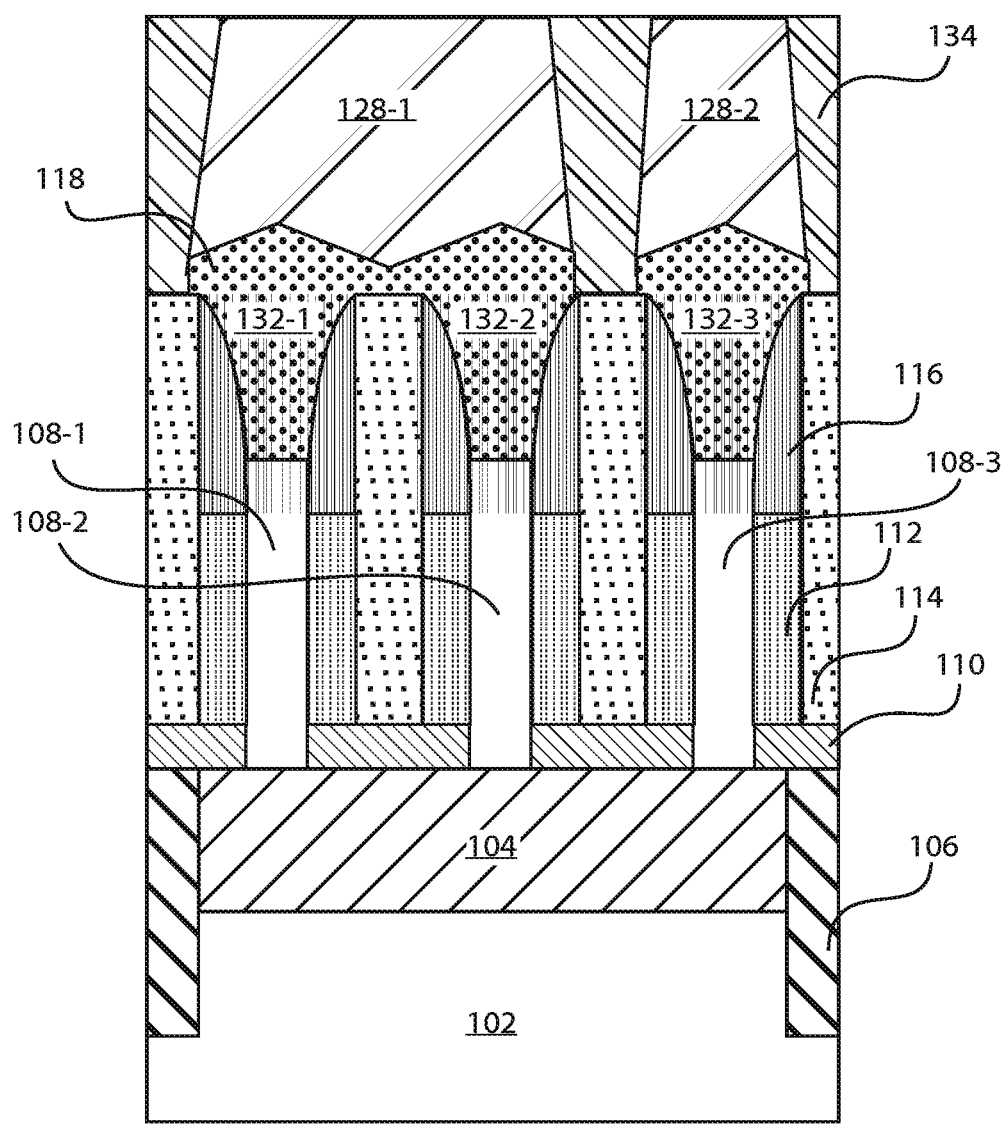
FIG. 6 is a cross-sectional view of the removal of the patterning masks and the formation of an ILD layer during the fabrication of the semiconductor device, in accordance with an embodiment of the present invention.
Figure 7:
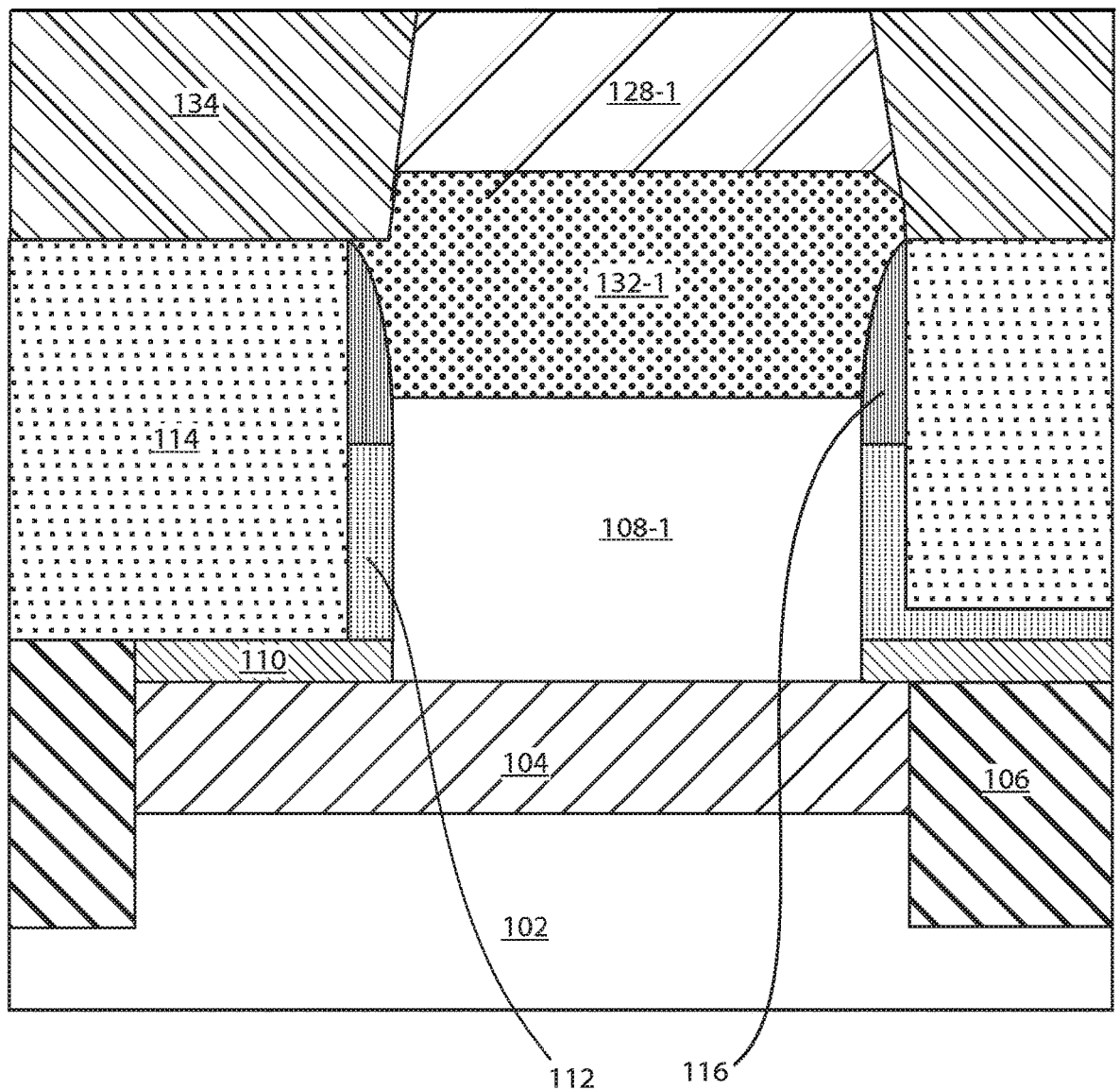
FIG. 7 is another cross-sectional view of the semiconductor device of FIG. 6, in accordance with an embodiment of the present invention.

With reference to FIGS. 6 and 7, in which FIG. 6 shows the cross-sectional view of the device 100 across the fin cut and FIG. 7 shows the cross-sectional view of the device 100 along the fin cut, the patterning material 122 is removed, and ILD layers 134 are formed within the first and second sets of cavities 126-1, 126-2 and 130-1 through 130-3. The patterning material 112 can be removed and the ILD layers 134 can be formed using any suitable processes in accordance with the embodiments described herein. For example, the ILD layers 134 can be formed by depositing dielectric material and planarizing the dielectric material to form the ILD layers 134 (e.g., using chemical-mechanical planarization (CMP)). The ILD layers 134 can include any suitable material in accordance with the embodiments described herein (e.g., SiO$_2$).

Figure 8:
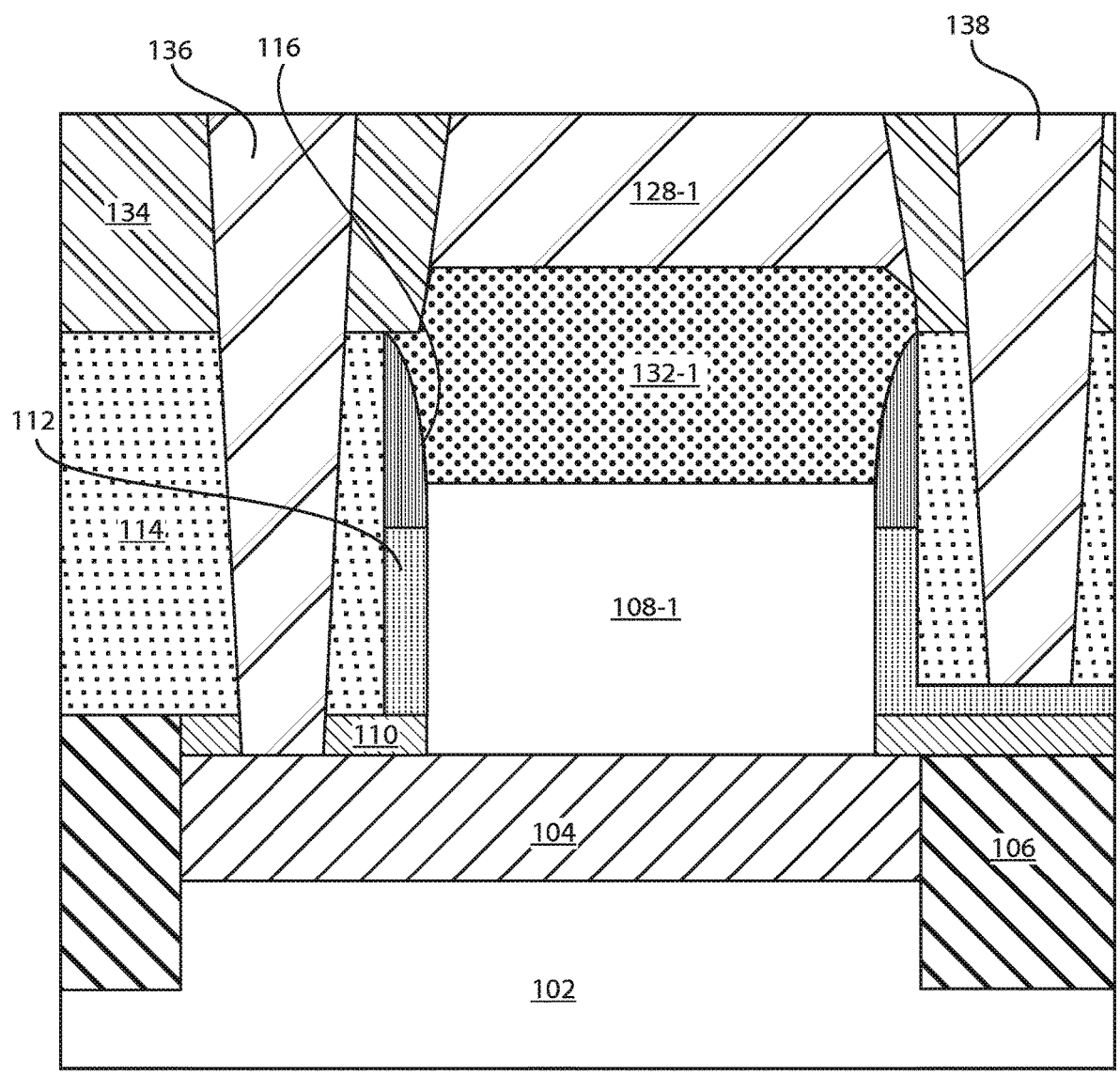
FIG. 8 is a cross-sectional view of the formation a bottom source/drain contact and a gate contact during the fabrication of the semiconductor device, in accordance with an embodiment of the present invention.

With reference to FIG. 8, the cross-sectional view of the device 100 along the fin cut is provided showing the formation of at least one bottom source/drain contact 136 on the bottom source/drain region 104, and at least one gate contact 138 on the gate structure 112. More specifically, openings corresponding to the contacts 136 and 138 can be patterned using an etch process, and conductive material can be formed within the openings to form the contacts 136 and 138. The bottom source/drain contact 136 and the gate contact 138 each have a positive tapered geometry (e.g., positive tapered profile) as a result of the damascene trench process used to form the bottom source/drain contact 136 and the gate contact 138.

The contacts 136 and 138 can include any suitable material in accordance with the embodiments described herein. Examples of materials that can be used to form the contacts 136 and 138 include, but are not limited to, copper (Cu), cobalt (Co), tantalum (Ta), ruthenium (Ru), titanium (Ti), and/or other suitable conductive materials or metals. For example, the contacts 136 and 138 can include, e.g., a metal silicide (e.g., a Ti-based silicide). In one embodiment, the contacts 128-1, 128-2, 136 and 138 include the same or similar material. In other embodiments, one or more of the contacts 128-1, 128-2, 136 and 138 can include a different material.

Figure 9:
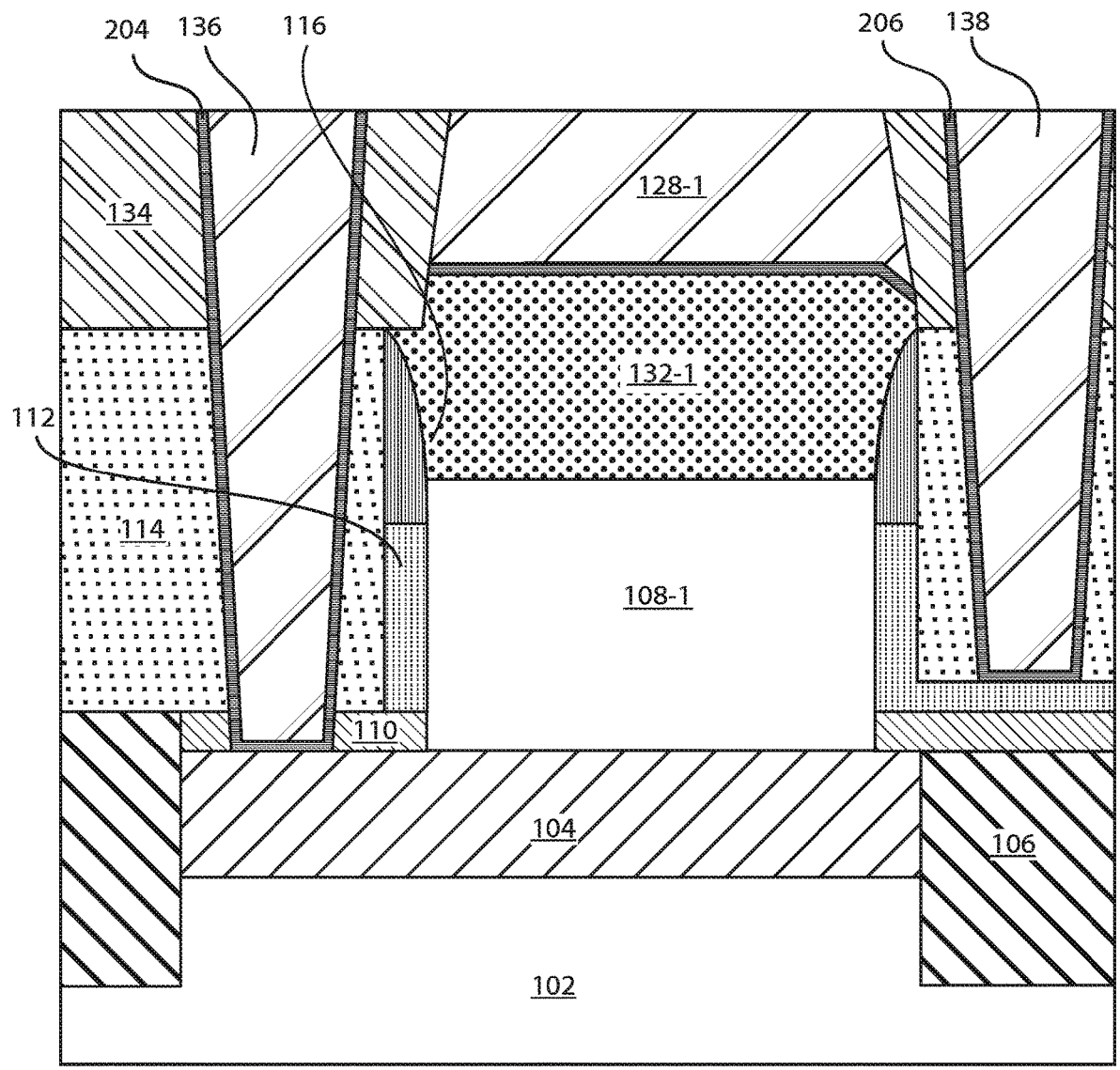
FIG. 9 is a cross-sectional view of the formation a bottom source/drain contact and a gate contact during the fabrication of the semiconductor device, in accordance with another embodiment of the present invention.

With reference to FIG. 9, a cross-sectional view of a device 200 along a fin cut is provided. The device 200 is similar to the device 100 shown in FIG. 8, except that a barrier liner 202 is along the bottom surface of the top source/drain contact 128-1, and barrier liners 204 and 206 are along sidewalls and the bottom surfaces of the contacts 136 and 138, respectively. There is a lack of the barrier liner 202 along the sidewalls of the top source/drain contact 128-1 due to the subtractive patterning process used to form the top source/drain contact 128-1.

The barrier liners 202 through 206 can include any suitable materials in accordance with the embodiments described herein. Examples of materials that can be used to form the barrier liners 202-1 through 202-3 include, but are not limited to, tantalum (Ta), titanium (Ti), tungsten W, tantalum nitride (TaN), titanium nitride (TiN), tungsten nitride (WN), doped or undoped silicon carbide (e.g., SiC), doped or undoped silicon nitride (e.g., SiN), etc. In one embodiment, the barrier liners 202 through 206 include a same material. In another embodiment, at least one of the barrier liners 202 through 206 include a different material.

With reference to FIG. 10, a block/flow diagram is provided illustrating a system/method 300 for fabricating a semiconductor device.

At block 302, a base structure of a vertical transistor device is formed on a substrate, with the base structure including a bottom source/drain region, one or more fins, one or more gate structures and one or more first interlevel dielectric (ILD) layers. The one or more fins are disposed on the bottom source/drain region, and the one or more gate structures are formed adjacent to each of the one or more fins. In one embodiment, the one or more fins can include at least first and second fins.

The base structure can further include at least one shallow trench isolation (STI) region disposed on the substrate to a height of the bottom source/drain region, a bottom spacer disposed on the bottom source/drain region and the at least one STI region adjacent to the one or more fins, one or more pairs of top spacers disposed on respective ones of the one or more gate structures adjacent to the one or more fins. The one or more first ILD layers are disposed on the bottom spacer between the one or more gate structures and the one or more pairs of top spacers to a height of the one or more pairs of top spacers.

The substrate and base structure components can include any suitable materials in accordance with the embodiments described herein.

For example, the substrate can include any suitable substrate structure, e.g., a bulk semiconductor, a semiconductor-on-insulator (SOI) substrate, etc. In one example, the substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide.

The bottom source/drain region can including epitaxial material epitaxially grown or deposited on the substrate.

The one or more fins can include, e.g., Si, Ge, SiGe, or other suitable semiconductor material.

The one or more gate structures can include a gate dielectric and a gate conductor. In one embodiment, the one or more gate structures can include high-k metal gate (HKMG) materials.

The STI regions can include, e.g., silicon dioxide ($SiO_2$) or other suitable dielectric material.

Examples of materials that can be used to form the bottom spacer include, but are not limited to, $SiO_2$, silicon nitride (SiN), etc.

The one or more first ILD layers can include, e.g., $SiO_2$ or other suitable dielectric material.

Further details regarding block 302 are described above with reference to FIGS. 1-2.

At block 304, top source/drain material is formed on the one or more fins. In the embodiment in which the one or more fins include at least first and second fins, the top source/drain material can be formed to be merged across the first and second fins. In one embodiment, the one or more fins can further include a third fin, and the top source/drain material can be formed to be merged across the first, second and third fins. The top source/drain region material can include any suitable material in accordance with the embodiments described herein. For example, the top source/drain region material can include an epitaxially grown material.

At block 306, top source/drain contact material is formed on the top source/drain material. The top source/drain contact material can be formed as wrap around contact material. The top source/drain contact material can include any suitable material in accordance with the embodiments described herein. Examples of materials that can be used to form the top source/drain contact material include, but are not limited to, copper (Cu), cobalt (Co), tantalum (Ta), ruthenium (Ru), titanium (Ti), and/or other suitable conductive materials or metals. In one embodiment, the top source/drain contact material includes a metal silicide. For example, the top source/drain contact material can include, e.g., a Ti-based silicide.

At block 308, the top source/drain contact material is subtractively patterned to form at least one top source/drain contact. More specifically, subtractively patterning the top source/drain contact material to form the at least one top source/drain contact can include forming patterning material, and etching through gaps between the pattern material up to the top source/drain material. The subtractive patterning further results in the formation of a first set of cavities. Any suitable process can be used to subtractively pattern the top source/drain contact material in accordance with the embodiments described herein. For example, a reactive-ion etch (RIE) process can be used. The subtractive patterning results in the at least one top source/drain contact having a positive tapered geometry.

At block 310, exposed end portions of the top source/drain material are cut to form at least one top source/drain region underneath the at least one top source/drain contact. The cutting further results in the formation of a second set of cavities underneath the first set of cavities. Any suitable process can be used to cut the exposed end portions of the top source/drain region material to form the top source/drain regions in accordance with the embodiments described herein.

In the embodiment in which the one or more fins include at least first and second fins, the at least one top source/drain region includes merged first and second top source/drain regions disposed on the first and second fins, and the at least one top source/drain contact includes at least a first top source/drain contact disposed on the merged first and second top source/drain regions. In the embodiment in which the one or more fins further include a third fin, a third top source/drain region disconnected from the merged first and second source/drain regions can be disposed on the third fin, and the at least one top source/drain contact further includes a second top source/drain contact disposed on the third source/drain region.

In one embodiment, a first barrier liner can be formed on the top source/drain material prior to formation of the at least one top source/drain contact. There is a lack of the first barrier liner along the sidewalls of the at least one top source/drain contact due to the subtractive patterning process used to form the at least one top source/drain contact. Examples of materials that can be used to form the first barrier liner include, but are not limited to, tantalum (Ta), titanium (Ti), tungsten W, tantalum nitride (TaN), titanium nitride (TiN), tungsten nitride (WN), doped or undoped silicon carbide (e.g., SiC), doped or undoped silicon nitride (e.g., SiN), etc.

Further details regarding blocks 304-310 are described above with reference to FIGS. 3-5 and 9.

At block 312, one or more second ILD layers are formed on the one or more first ILD layers. More specifically, the one or more second ILD layers are formed within the first and second sets of cavities. For example, the one or more second ILD layers can be formed by depositing dielectric material and planarizing the dielectric material to form the ILD layers (e.g., using chemical-mechanical planarization (CMP)). The one or more second ILD layers can include any suitable material in accordance with the embodiments described herein (e.g., $SiO_2$).

At block 316, a plurality of contacts including at least one bottom source/drain contact on the bottom source/drain region and at least one gate contact on the one or more gate structures are formed. More specifically, forming the plurality of contacts can include forming a plurality of openings corresponding to the plurality of contacts using an etch process, and forming conductive material within the plurality of openings.

The plurality of contacts can include any suitable material in accordance with the embodiments described herein. Examples of materials that can be used to form the plurality of contacts include, but are not limited to, copper (Cu), cobalt (Co), tantalum (Ta), ruthenium (Ru), titanium (Ti), and/or other suitable conductive materials or metals. For example, the plurality of contacts can include, e.g., a metal silicide (e.g., a Ti-based silicide). The formation of the plurality of contacts result in the plurality of contacts having a negative tapered geometry.

In one embodiment, the at least one top source/drain contact, the at least one bottom source/drain contact and the at least one gate contact include the same or similar material. In other embodiments, these contacts can include a different material.

In one embodiment, forming the at least one bottom source/drain contact and the at least one gate contact can further include forming a second barrier liner and a third barrier liner along sidewalls and the bottom surfaces of the at least one bottom source/drain contact and the at least one gate contact, respectively. Examples of materials that can be used to form the second and third barrier liners include, but are not limited to, tantalum (Ta), titanium (Ti), tungsten W, tantalum nitride (TaN), titanium nitride (TiN), tungsten nitride (WN), doped or undoped silicon carbide (e.g., SiC), doped or undoped silicon nitride (e.g., SiN), etc.

In one embodiment, the first, second and third barrier liners include the same material. In other embodiments, at least one of the first, second and third barrier liners can include a different material.

Further details regarding blocks 312-14 are described above with reference to FIGS. 6-9.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming top source/drain contact material on top source/drain material disposed on one or more fins of a base structure;
    subtractively patterning the top source/drain contact material to form at least one top source/drain contact having a positive tapered geometry; and
    cutting exposed end portions of the top source/drain material to form at least one top source/drain region underneath the at least one top source/drain contact.

2. The method of claim 1, wherein the base structure further includes:
    a bottom spacer disposed on a bottom source/drain region and adjacent to the one or more tins;
    one or more pairs of top spacers disposed on respective gate structures; and
    one or more first interlevel dielectric (ILD) layers disposed on the bottom spacer to a height of the one or more pairs of top spacers.

3. The method of claim 2, further comprising forming one or more second ILD layers on the one or more first ILD layers.

4. The method of claim 1, wherein:
    the one or more fins include at least first and second fins;
    the top source/drain material is formed to be merged across the first and second fins;
    the at least one top source/drain region includes merged first and second top source/drain regions disposed on the first and second fins; and
    the at least one top source/drain contact includes a first top source/drain contact disposed on the merged first and second top source/drain regions.

5. The method of claim 4, wherein:
    the one or more fins further include a third fin;
    the top source/drain material is formed to be merged across the first, second and third fins; and
    the at least one top source/drain region further includes a third top source/drain region disconnected from the merged first and second source/drain regions disposed on the third fin.

6. The method of claim 1, further comprising forming a plurality of contacts including at least one bottom source/drain contact and at least one gate contact.

7. The method of claim 6, wherein each of the plurality of contacts has a negative tapered geometry.

8. The method of claim 6, wherein a first barrier liner is disposed around a bottom surface of the at least one top source/drain contact, and wherein second and third barrier liners are disposed around sidewalls and bottom surfaces of the at least one bottom source/drain contact and the at least one gate contact, respectively.

9. A method for fabricating a semiconductor device, comprising:
    forming top source/drain material merged across at least a first fin and a second fin disposed on a bottom source/drain region of a base structure;
    forming top source/drain contact material on the top source/drain material;
    subtractively patterning the top source/drain contact material to form at least a first top source/drain contact having a positive tapered geometry; and
    cutting exposed end portions of the top source/drain material to form a plurality of top source/drain regions including at least merged first and second top source/drain regions underneath the at least one top source/drain contact, the first top source/drain contact being formed on the merged first and second top source/drain regions.

10. The method of claim 9, wherein the base structure further includes:
    at least one shallow trench isolation (STI) region disposed on the substrate to a height of the bottom source/drain region;
    a bottom spacer disposed on the bottom source/drain region and adjacent to the fins;
    at least first and second pairs of top spacers disposed on respective gate structures; and
    one or more first interlevel dielectric (ILD) layers disposed on the bottom spacer to a height of the pairs of top spacers.

11. The method of claim 10, further comprising forming one or more second ILD layers on the one or more first ILD layers.

12. The method of claim 9, wherein:
    the one or more fins further include a third fin;
    the top source/drain material is formed to be merged across the first, second and third fins; and
    the plurality of top source/drain regions further includes a third top source/drain region disconnected from the merged first and second source/drain regions disposed on the third fin.

13. The method of claim 9, further comprising forming a plum contacts including at least one bottom source/drain contact and at least one gate contact.

14. The method of claim 13, wherein each of the plurality of contacts has a negative tapered geometry.

15. The method of claim 13, wherein a first barrier liner is disposed around a bottom surface of the at least one top source/drain contact, and wherein second and third barrier liners are disposed around sidewalls and bottom surfaces of the at least one bottom source/drain contact and the at least one gate contact, respectively.

16. A semiconductor device, comprising:
    a substrate;
    a bottom source/drain region disposed on the substrate;
    one or more fins disposed on the bottom source/drain region;
    one or more top source drain/regions disposed on respective ones of the one or more fins;
    one or more gate structures adjacent to the one or more fins;
    at least one bottom source/drain contact and at least one gate contact each having a negative tapered geometry; and at least one top source/drain contact having a positive tapered geometry.

17. The device of claim 16, wherein:

the one or more fins include at least a first fin and a second fin;

the at least one top source/drain region includes merged first and second top source/drain regions disposed on the first and second fins; and the at least one top source/drain contact includes a first top source/drain contact disposed on the merged first and second top source/drain regions.

18. The device of claim 17, wherein:

the one or more fins further include a third fin; and the at least one top source/drain region further includes a third top source/drain region disconnected from the merged first and second source/drain regions disposed on the third fin.

19. The device of claim 16, further comprising a first barrier liner disposed along, a bottom surface of the at least one top source/drain contact, and second and third barrier lines along bottom surfaces and sidewalls of the at least one bottom source/drain contact and the at least one gate contact, respectively.

20. The device of claim 16, further comprising:

at least one shallow trench isolation (STI) region disposed on the substrate to a height of the bottom source/drain region;

a bottom spacer disposed on the bottom source/drain region and the at least one STI region adjacent to the one or more fins, the one or more gate structures being disposed on the bottom spacer;

one or more pairs of top spacers disposed on the one or more gate structures adjacent to the one or more fins;

one or more first interlevel dielectric (ILD) layers disposed on the bottom spacer to a height of the one or more pairs of top spacers; and one or more second ILD layers disposed on the one or more first ILD layers to a height of the plurality of contacts.

* * * * *